(12) United States Patent
Kadowaki et al.

(10) Patent No.: US 6,603,175 B2
(45) Date of Patent: Aug. 5, 2003

(54) OPERATING CIRCUIT WITH VOLTAGE REGULAR CIRCUIT HAVING AT LEAST A PARTIALLY DEPLETED SOI FIELD EFFECT TRANSISTOR

(75) Inventors: Tadao Kadowaki, Suwa (JP); Akihiko Ebina, Suwa (JP); Masayuki Yamaguchi, Suwa (JP); Yoko Sato, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 73 days.

(21) Appl. No.: 09/855,693

(22) Filed: May 16, 2001

(65) Prior Publication Data
US 2002/0038888 A1 Apr. 4, 2002

(30) Foreign Application Priority Data
Oct. 2, 2000 (JP) ....................... 2000-302647

(51) Int. Cl.[7] .............................................. H01L 27/01
(52) U.S. Cl. ....................... 257/347; 257/348
(58) Field of Search ................. 257/347, 348, 257/288

(56) References Cited

U.S. PATENT DOCUMENTS

| | | | |
|---|---|---|---|
| 5,818,781 A | * 10/1998 | Estakhri et al. | 365/226 |
| 6,087,893 A | * 7/2000 | Oowaki et al. | 327/537 |
| 6,160,292 A | * 12/2000 | Flaker et al. | 257/347 |
| 2001/0045602 A1 | * 11/2001 | Maeda et al. | 257/347 |

* cited by examiner

Primary Examiner—Vu A. Le
Assistant Examiner—Brad Smith
(74) Attorney, Agent, or Firm—Oliff & Berridge, PLC.

(57) ABSTRACT

A semiconductor integrated circuit comprising: a first power line which supplies a first voltage potential; a second power line which supplies a second voltage potential that is lower than the first voltage potential; a voltage regulator circuit connected electrically to the first and second power lines; a third power line which supplies a constant voltage generated by a voltage regulator circuit, with reference to the first voltage potential; and an operating circuit connected electrically to the first and third power lines. At least one transistor configuring the voltage regulator circuit is a partially-depleted SOI field-effect transistor in which a body region and a source region are connected electrically. At least one transistor configuring the operating circuit is a partially-depleted SOI field-effect transistor in which a body region is in an electrically floating state.

21 Claims, 13 Drawing Sheets

(A) BULK-TYPE MOSFET   (B) FULLY-DEPLETED SOI MOSFET   (C) PARTIALLY-DEPLETED SOI MOSFET

OPERATING CIRCUIT WITH VOLTAGE REGULAR CIRCUIT HAVING AT LEAST A PARTIALLY DEPLETED SOI FIELD EFFECT TRANSISTOR

Japanese patent application No. 2000-302647, filed on Oct. 2, 2000, is hereby incorporated by reference in its entirety.

1. Technical Field

The present invention relates to a semiconductor integrated circuit that comprises a field-effect transistor of a silicon-on-insulator (SOI) structure, together with a timepiece and electronic equipment provided with the same.

2. Background

Recent advances in integration techniques and communications technology have led to the spread of more portable electronic equipment such as cellphones and data terminals, and there is demand for even lower power consumptions of the semiconductor integrated circuits incorporated therein.

For example, a recent trend has been an increase in wristwatches that do not use a primary battery, from environmental considerations, but instead charge a secondary battery by self-generated power obtained by self-winding, a solar cell, or the thermoelectric effect, to act as a power source for a motor and an internal control IC. Another recent trend is the implementation of a watch in which hands are driven mechanically by a mainspring and, at the same time, power is generated for a quartz oscillator or internal control IC, guaranteeing timekeeping that is as accurate as a quartz timepiece. In such a case, the upper limits on the operation voltage and operation current that are permitted for the internal control IC are 0.5 volts (V) and 50 nano-amperes (nA), by way of example.

In general, this control IC is configured of metal-oxide semiconductor (hereinafter abbreviated to MOS) transistors. To reduce the power consumption of such a control IC, it is obvious to reduce the parasitic capacitances of the MOS transistors therein, but the most effective method is to reduce the operation voltage, because the power consumption is proportional to the square of the operation voltage (power voltage).

Devices of a silicon-on-insulator (SOI) construction are characterized in that, if the junction capacitance is reduced, it becomes possible to reduce the operation voltage by using a lower threshold voltage. They are therefore attracting attention as a technique of implementing circuits that are required to operate at extremely low power consumptions, as mentioned above.

In such an SOI MOS field-effect transistor (hereinafter abbreviated to FET), a body region is formed from a silicon layer in the region corresponding to the channel region of a bulk-structure MOSFET. The behavior and characteristics of this transistor depend on whether or not there is a neutral region in which there are carriers moving between the source region and the drain region.

Such transistors can be divided into two types: ones in which there is a neutral region within the body region, which are called partially depleted (PD), and ones in which there is no neutral region, called fully depleted (FD). The presence of this neutral region depends on the thickness of the silicon layer that forms the body region.

A fully-depleted SOI MOSFET has excellent saturation characteristics and has the advantage that it can be applied to reduced power consumptions. However, there is a disadvantage in that the techniques of fabricating the requisite thin silicon layer are difficult and thus it is not possible to achieve accurate threshold voltage control.

In contrast thereto, a partially-depleted SOI MOSFET has advantages in that it has a fabrication margin due to the thickness of the silicon layer of the body region, and also the same bulk-orientated processing can be used to fabricate it. However, it has a disadvantage in that, when the body region is in a floating state, the substrate floating effect caused by the carriers within the neutral region leads to instability, and also a kink is generated by the parasitic bipolar operation.

Simply using fully-depleted SOI MOSFETs in the fabrication of a semiconductor integrated circuit designed to operate at an ultra-low power consumption, such as a wristwatch IC, causes problems in that threshold voltage control becomes difficult because of the thinness of the silicon layer, and also the increased fabrication costs make it difficult to mass-produce it. Simply using partially-depleted SOI MOSFETs in the fabrication of the semiconductor integrated circuit, on the other hand, means that operation at extremely low power consumptions is not possible because of instability caused by factors such as the abovementioned substrate floating effect.

SUMMARY

According to one aspect of the present embodiment, there is provided a semiconductor integrated circuit comprising: a first power line which supplies a first voltage potential;

a second power line which supplies a second voltage potential that is lower than the first voltage potential;

a voltage regulator circuit connected electrically to the first and second power lines;

a third power line which supplies a voltage generated by the voltage regulator circuit, with reference to the first voltage potential; and an operating circuit connected electrically to the first and third power lines;

wherein at least one transistor among transistors comprising the voltage regulator circuit is a partially-depleted SOI field-effect transistor in which a body region and a source region are connected electrically; and wherein at least one transistor among transistors comprising the operating circuit is a partially-depleted SOI field-effect transistor in which the body region is in an electrically floating state.

According to another aspect of the present embodiment, there is provided a semiconductor integrated circuit comprising: a first power line which supplies a first voltage potential;

a second power line which supplies a second voltage potential that is lower than the first voltage potential;

a first circuit connected electrically to the first and second power lines;

a third power line which supplies a constant voltage generated by the first circuit with reference to the first voltage potential; and a second circuit connected electrically to the first and third power lines, wherein at least one transistor among transistors comprising the first circuit is a partially-depleted SOI field-effect transistor in which a body region and a source region are connected electrically; and wherein at least one transistor among transistors comprising the second circuit is a partially-depleted SOI field-effect transistor in which the body region is in an electrically floating state.

According to a further aspect of the present embodiment, there is provided a semiconductor integrated circuit comprising:

a digital circuit section;

an analog circuit section;

wherein the digital circuit section comprises a plurality of field-effect transistors and at least one transistor is a partially-depleted SOI field-effect transistor in which a body region is in an electrically floating state; and wherein the analog circuit section comprises a plurality of field-effect transistors and at least one transistor is a partially-depleted SOI field-effect transistor in which a body region and a source region are connected electrically.

DETAILED DESCRIPTION

Embodiments of the present invention are described below with reference to the accompanying drawings.

1. SOI MOSFET

The description first concerns SOI MOSFETs.

1.1 Fully Depleted Type and Partially Depleted Type

Figure 1:
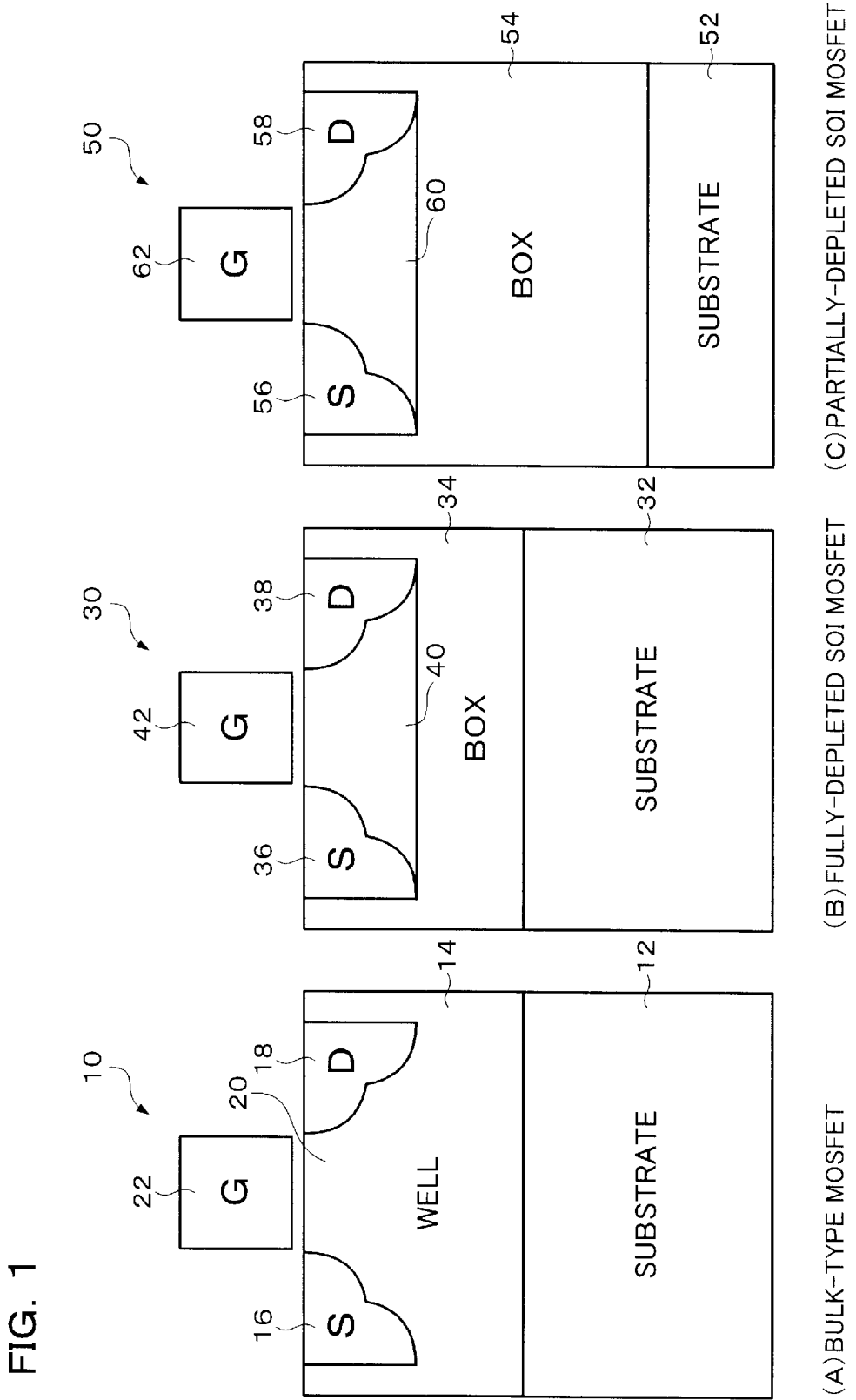
FIGS. 1A, 1B, and 1C are schematic sections through the structure of a prior-art bulk-type MOSFET and SOI MOSFETs.

Sections through a prior-art bulk-structure MOSFET and SOI MOSFETs are shown schematically in FIGS. 1A, 1B, and 1C.

In a prior-art bulk-structure MOSFET 10, a source region (S) 16 and drain region (D) 18 are formed by ion implantation in a well 14 formed in a silicon substrate 12, as shown in FIG. 1A. The source region 16 and the drain region 18 are formed on either side of a channel region 20 at a separation that depends on the channel length. A gate electrode (G) 22 is disposed on top of the channel region 20, with a gate oxide film therebetween.

In contrast thereto, MOSFETs 30 and 50 of a fully-depleted (hereinafter abbreviated to FD) and a partially-depleted (hereinafter abbreviated to PD) structure, respectively, have a similar configuration in which a buried oxide layer (hereinafter called a BOX layer) is formed in the top of the silicon substrate, as shown in FIGS. 1B and 1C.

In other words, the SOI MOSFET 30 or 50 has a configuration in which a BOX layer 34 or 54 is formed on a silicon substrate 32 or 52 that is used in a prior-art bulk-structure structure, then a silicon layer is formed on top of that BOX layer 34 or 54. A source region (S) 36 or 56 and a drain region (D) 38 or 58 are formed by the implantation of impurities on either side of the silicon layer formed on the BOX layer 34 or 54. The silicon layer between the source region (S) 36 or 56 and the drain region (D) 38 or 58 is called a body region (or body portion) 40 or 60, and a gate electrode (G) 42 or 62 is formed on the upper side of the corresponding body region 40 or 60.

The difference between the FD and PD structures lies in the thicknesses of the silicon layers that form the body regions 40 and 60, as shown schematically in FIGS. 1B and 1C.

With the PD structure, a depleted layer in which there are no carriers is mixed with a neutral region in which there are many carriers, within the body region 40.

With the FD structure, on the other hand, there is no neutral region within the body region 40, which is formed of a depleted layer alone.

The operation of an SOI MOSFET is described in a simple manner herein, taking as an example an n-channel MOSFET in which the voltage potential of the body region is in a state in which it is not fixed (a floating state).

There is no voltage potential gradient within the neutral region with the PD structure, which means that the voltage potential barrier ($\phi_h$) between the source region and the body region with respect to the large number of carriers is greater with the PD structure than the FD structure. If a given bias is applied between the source region and the drain region, therefore, electrons and holes are generated by the impact ionization phenomenon, and the holes which form a large number of carriers migrate towards the source region.

Since there is a voltage potential barrier ($\phi_h$) with respect to holes at the source end, some of the holes accumulate in the body region. Since the voltage potential barrier ($\phi_h$) is higher with the PD structure than the FD structure, a greater number of carriers accumulate in the body region with the PD structure.

If a large number of carrier holes continue to accumulate in the PD body region, the bias effect will reduce the threshold voltage of that n-channel MOSFET. The drain current will therefore increase dramatically.

In order to reduce the substrate-floating effect caused by a kink in the drain current and changes in the transitional threshold voltage, due to variations in the voltage potential of the PD body region, it is necessary to either use a device in which the voltage potential of the body region is fixed (body-tied), at the sacrifice of integration density, or use a FD structure which is more difficult to fabricate.

However, since this embodiment of the present invention is applied to the specialized field of ultra-low power consumptions, such as a wristwatch IC, the effects of the floating substrate can be reduced by operation under a low electrical field in which the impact ionization phenomenon can be ignored.

In other words, the bias between the body region and the source region under a high electric field causes the generation of a large number of carriers due to the impact ionization phenomenon, and these carriers accumulate in the body region. This means that the voltage potential of the body region rises with any rise in the gate voltage and, as a result, the parasitic bipolar effect ensures that the drain current increases if the threshold voltage drops.

If the gate voltage falls from such a state, the voltage potential of the body does not decrease immediately. This is because there is a large time constant in the process of destruction of a large number of carriers. As a result, the drain current remains for a while at a value that is higher than its initial value. Since the subthreshold current including the turn-off current will therefore increase further, this is inconvenient from the point of view of reducing the power consumption.

In low electrical fields in which the impact ionization phenomenon can be ignored, on the other hand, changes in the large number of carriers are governed by the generation and recombination mechanisms, so that there is substantially no change in the number of carriers when the gate voltage has changed under normal operation.

While the gate voltage of the MOSFET is increasing, therefore, the voltage potential of the body region will rise and the threshold voltage will fall, due to the delay in the diffusion of the depleted layer. This increases the drain current in the region in which the gate voltage is high.

Conversely, while the gate voltage is decreasing, the voltage potential of the body region will fall and the threshold voltage will rise, due to the delay in the contraction of the depleted layer. This reduces the drain current in the region in which the gate voltage is low.

Since these two phenomena make the changes in subthreshold levels steeper, increase the on-current, and reduce the turn-off current, they enable dramatic improvements in capabilities during low-voltage operation and power-saving operation.

Figure 2:
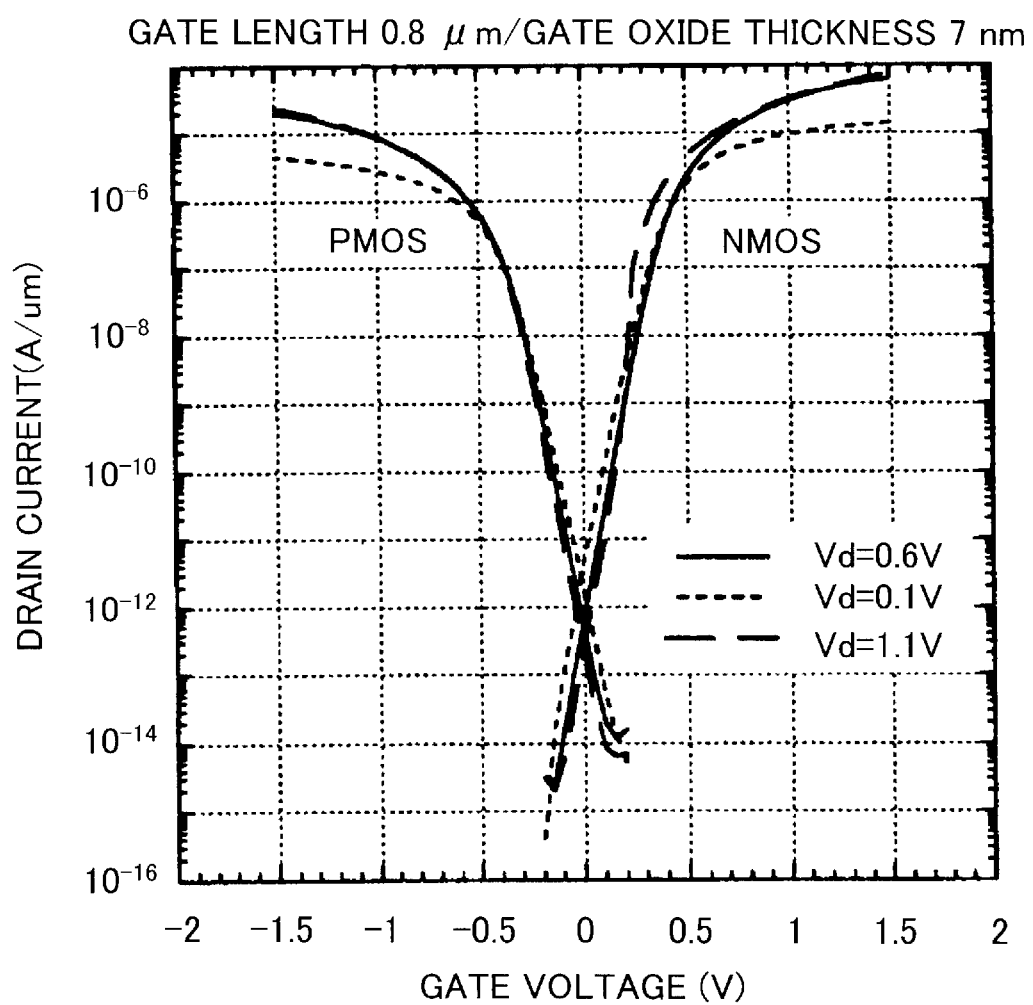
FIG. 2 is illustrative of an example of the subthreshold characteristic of a typical PD type of SOI MOSFET.

An example of the subthreshold characteristic of a typical PD type of SOI MOSFET is shown in FIG. 2.

This graph shows changes in subthreshold current in the subthreshold region for p-channel and n-channel MOS devices, with gate voltage (units: V) plotted along the horizontal axis and drain current (units: A/$\mu$m) plotted along the vertical axis.

As can be seen from the graph, a kink is generated for the n-channel MOSFET when the voltage Vd between the drain region and the source region is 1.1 V, and a steep subthreshold change is maintained under low electrical fields such as a Vd of 0.1 V or 0.6 V.

Thus in specialist fields where extremely low power consumptions are required, such as in wristwatch ICs, it is possible to make positive use of the substrate floating effect that is considered to be a disadvantage in the PD type of SOI MOSFET of the prior art, to improve the operation functions at low voltages and with low power consumptions. This is also advantageous from the point of view of fabrication costs, because existing bulk-orientated processing can be adapted therefor.

1.2 Body-Floated Type and Body-Tied Type

A body-tied SOI MOSFET is used as a device that reduces the effects of the floating substrate in an SOI MOSFET in which the body region is floating as described above.

In a body-tied MOSFET, the voltage potential of the body region shown in FIG. 1B or 1C is fixed. With the body-tied configuration, the large number of carriers that accumulate in the body region can be removed rapidly by connecting that body region to the source region (source-tied), by way of example. This makes it possible to eliminate the kink phenomenon and bipolar effects caused by the rise in voltage potential of the body region.

Figure 3:
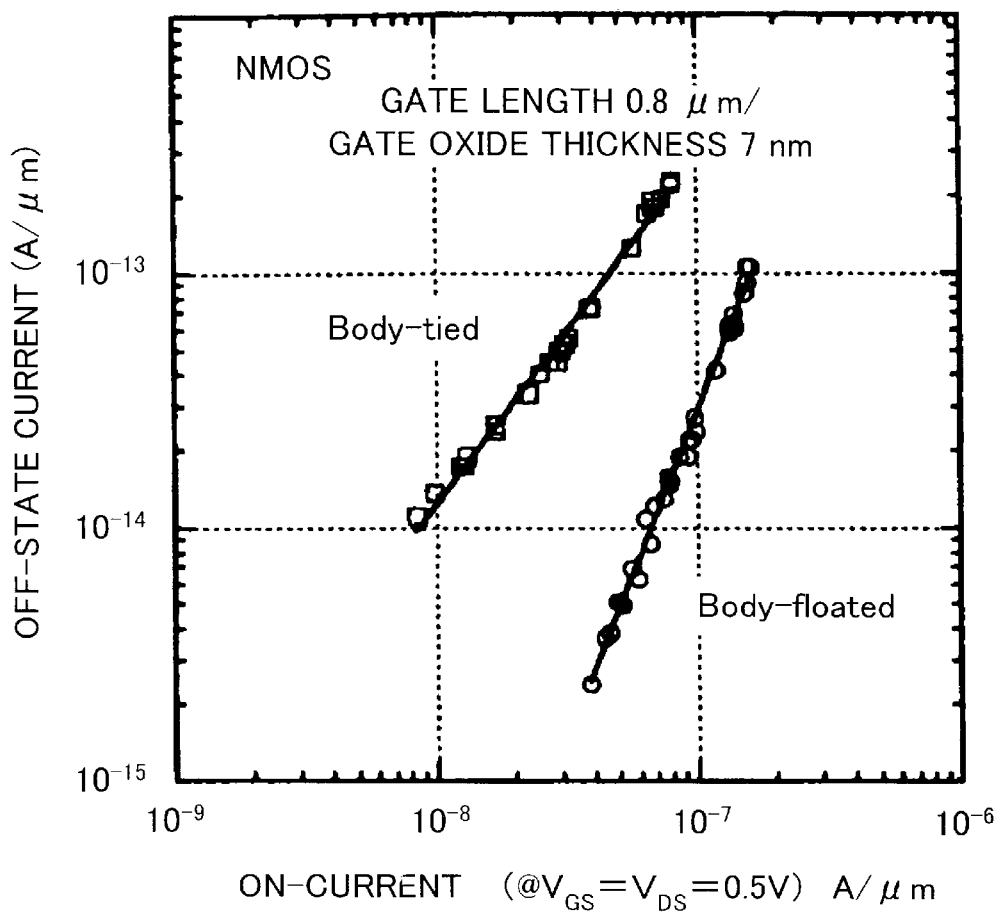
FIG. 3 is illustrative of an example of the on/off current ratios of PD SOI MOSFETs (n-channel) of the body-floated structure and the body-tied structure.
Figure 4:
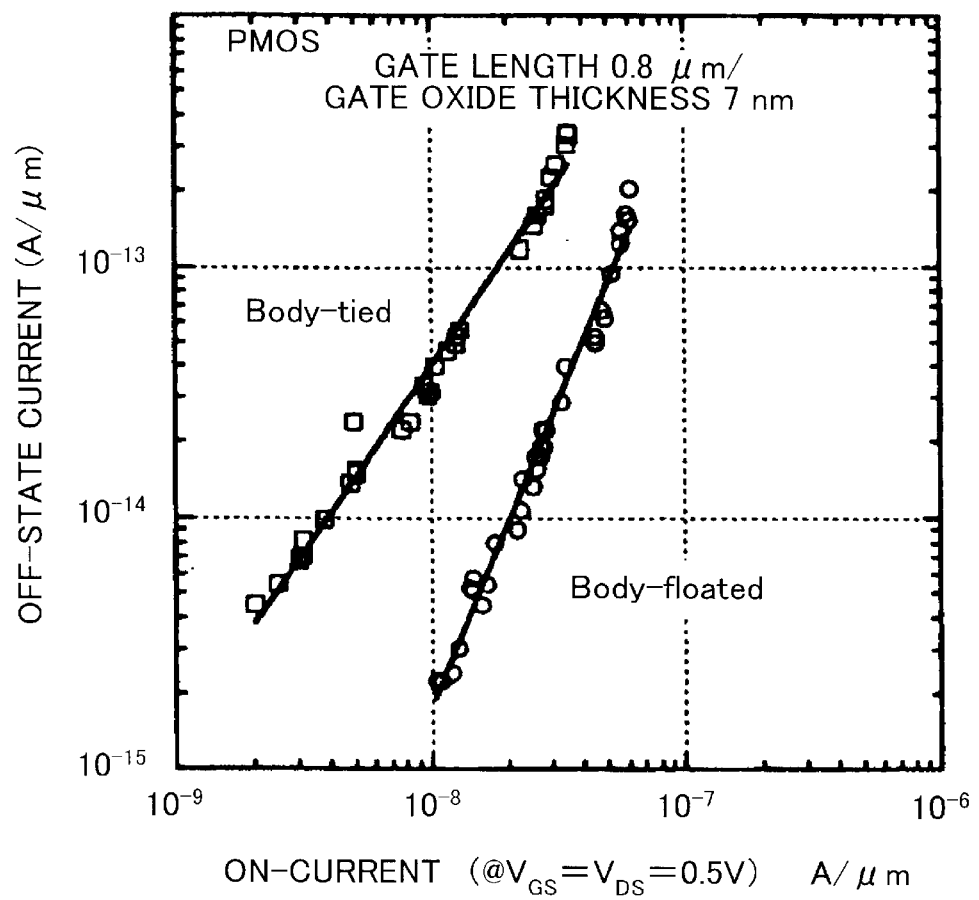
FIG. 4 is illustrative of an example of the on/off current ratios of PD SOI MOSFETs (p-channel) of the body-floated structure and the body-tied structure.

The graphs in FIGS. 3 and 4 show the on/off current ratios of PD SOI MOSFETs wherein the body region is floating (body-floated structure) and fixed (body-tied structure).

FIG. 3 shows the on/off current ratio of an n-channel transistor and FIG. 4 shows that of a p-channel transistor, with on-current ($V_{GS}=V_{DS}=0.5$ V) (units: A/$\mu$m) plotted along the horizontal axis and off-state current (units: A/$\mu$m) plotted along the vertical axis.

These graphs show that, to obtain the same on-current, the off-state current has to be greater with the body-tied structure than with the body-floated structure, demonstrating that the body-floated structure is superior for operation at a low power consumption. This is the same for both n-channel and p-channel transistors.

To obtain the same turn-off current, on the other hand, the on-current is greater with the body-floated structure than with the body-tied structure, so that a steep subthreshold characteristic is obtained and thus the body-floated configuration enables high-speed operation. This is the same for both n-channel and p-channel structures.

Figure 5A:
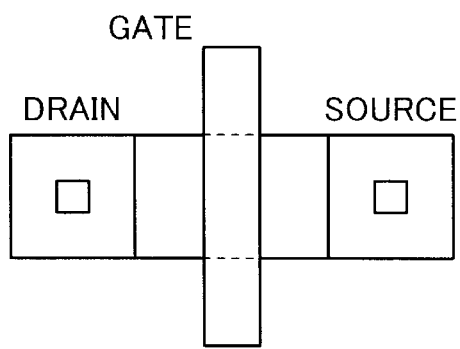
FIGS. 5A and 5B show examples of the layouts of PD SOI MOSFETs of the body-floated structure and the body-tied structure.
Figure 5B:
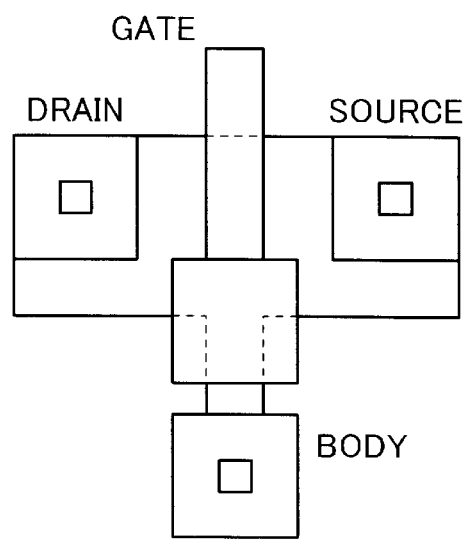

Examples of the layouts of body-floated and body-tied PD SOI MOSFETs are shown in FIGS. 5A and 5B.

With the body-tied structure, it is necessary to provide electrodes for fixing the voltage potential of the body region, so that the area occupied by the body-tied structure MOSFET shown in FIG. 5B is greater than that of the body-floated structure MOSFET shown in FIG. 5A.

In a comparison of the body-floated structure and body-tied structure for a PD type of SOI MOSFET, it is clear that the body-floated type has advantages concerning the on/off current ratio and the layout area.

However, this embodiment of the present invention is attractive in that it provides a PD type of SOI MOSFET of a body-tied structure with DC and AC characteristics that are similar to those of prior-art bulk-orientated structures, by the use of a source-tied configuration in which the body region and the source region are connected electrically.

Figure 6:
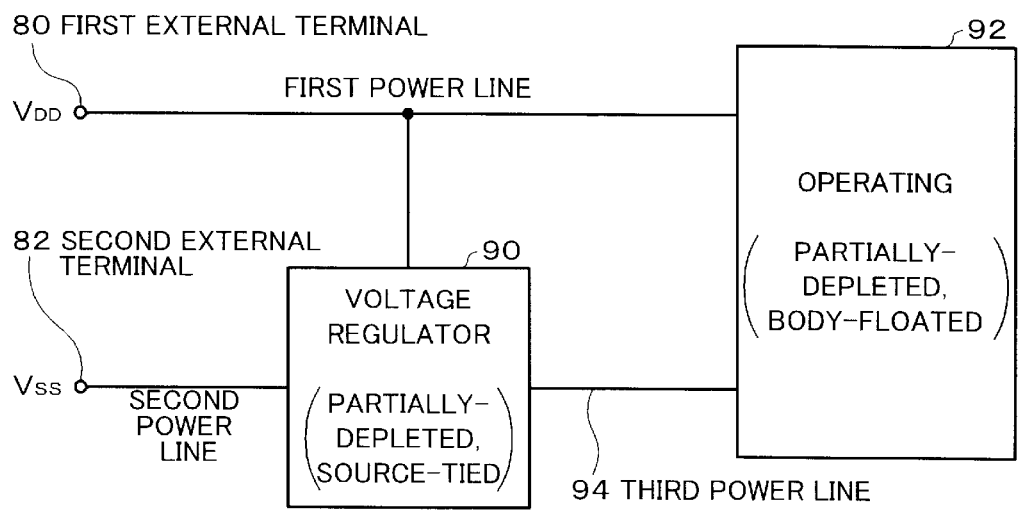
FIG. 6 shows the basic structure of the semiconductor integrated circuit in accordance with this embodiment of the present invention.

The basic structure of the above described semiconductor integrated circuit in accordance with this embodiment of the present invention is shown in outline in FIG. 6.

The semiconductor integrated circuit of this embodiment comprises first and second external terminals 80 and 82 which are connected electrically to a first power line $V_{DD}$ and a second power line $V_{SS}$ which supply first and second voltage potentials from the exterior.

The first power line $V_{DD}$ is connected electrically to a voltage regulator circuit 90 and an operating circuit 92.

The second power line $V_{SS}$ is connected to the voltage regulator circuit 90.

Since it is likely that a high voltage which will make it impossible to reduce the above described substrate floating effect will be applied to the voltage regulator circuit 90, at least one transistor that is a structural element of the circuit is make to have a body-tied structure (particularly a source-tied type of structure in which the body region (i.e., body portion) is connected electrically to the source region), to ensure that a stable constant voltage is generated independently of any fluctuations in the first and second voltage potentials applied from the outside, which is a characteristic of prior-art bulk fabrication.

At least one transistor that is a structural component of the operating circuit 92 is made to have a body-floated structure, as a portion that enables extremely low power consumptions for the logic circuits and the like which make up the larger part of the other circuitry.

In other words, it is possible to cause the operating circuit 92, which has been adapted to a body-floated structure, to operate at an extremely low power consumption by supplying through a third power line 94 a constant voltage that is generated by the voltage regulator circuit 90, which has a body-tied structure, using the first power line $V_{DD}$ as a reference voltage potential. This is useful in body-floated circuitry that tends to become unstable due to the substrate floating effect.

The entire voltage regulator circuit 90 can be made of the body-tied type of structure. The entire operating circuit 92 can be made of the body-floated type of structure.

The use of partially-depleted SOI transistors ensures that existing fabrication equipment can be adapted therefor and makes it possible to obtain good control over the threshold voltage and an excellent cost-performance ratio.

The semiconductor integrated circuit in accordance with this embodiment of the present invention is described more specifically below.

Figure 7:
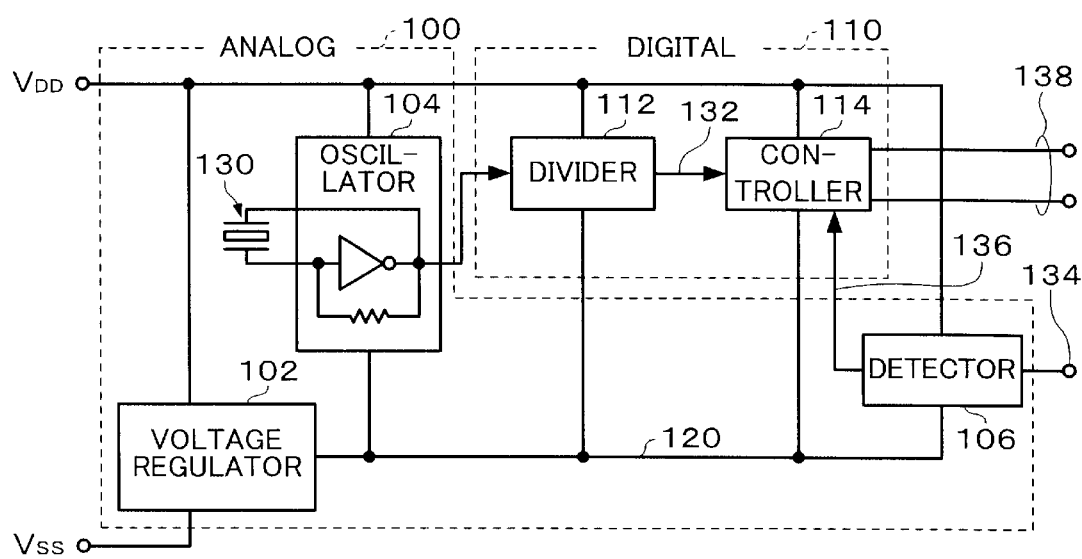
FIG. 7 shows an example of the configuration of a wristwatch IC in accordance with this embodiment of the present invention that operates at an extremely low power consumption.

2. Wristwatch IC Operation at Extremely Low Power Consumption 2.1 Circuit Configuration An example of the configuration of a wristwatch IC which operates at an extremely low power consumption, and which uses the semiconductor integrated circuit in accordance with this embodiment, is shown in FIG. 7.

This wristwatch IC comprises an analog circuit portion 100 that is necessary for alignment and a digital circuit section 110 that performs logical operations.

The analog circuit section 100 comprises a voltage regulator circuit (voltage regulator) 102, an oscillator (oscillator) 104, and a detector (detector) 106.

The digital circuit section 110 comprises a divider (divider) 112 and a controller (controller) 114.

The analog circuit section 100 is connected to the first power line $V_{DD}$ and the second power line $V_{SS}$.

The first power line $V_{DD}$ and the second power line $V_{SS}$ are connected together within the voltage regulator circuit 102 of the analog circuit section 100. This voltage regulator circuit 102 can generate a given low constant voltage with reference to the voltage potential of the first power line $V_{DD}$, using the voltage potential difference between the first power line $V_{DD}$ and the second power line $V_{SS}$ as the operation (power) voltage. This low constant voltage is supplied to the various circuits by the first power line $V_{DD}$ and another power line 120.

The oscillator 104 and the detector 106 are connected to the first power line $V_{DD}$ and the power line 120, and the voltage potential difference between these two power lines becomes the operation voltage (power source).

The divider 112 and the controller 114 of the digital circuit section 110 are also connected to the first power line $V_{DD}$ and the power line 120, and operate using the voltage potential difference between those two power lines as the operation (power) voltage.

Figure 8:
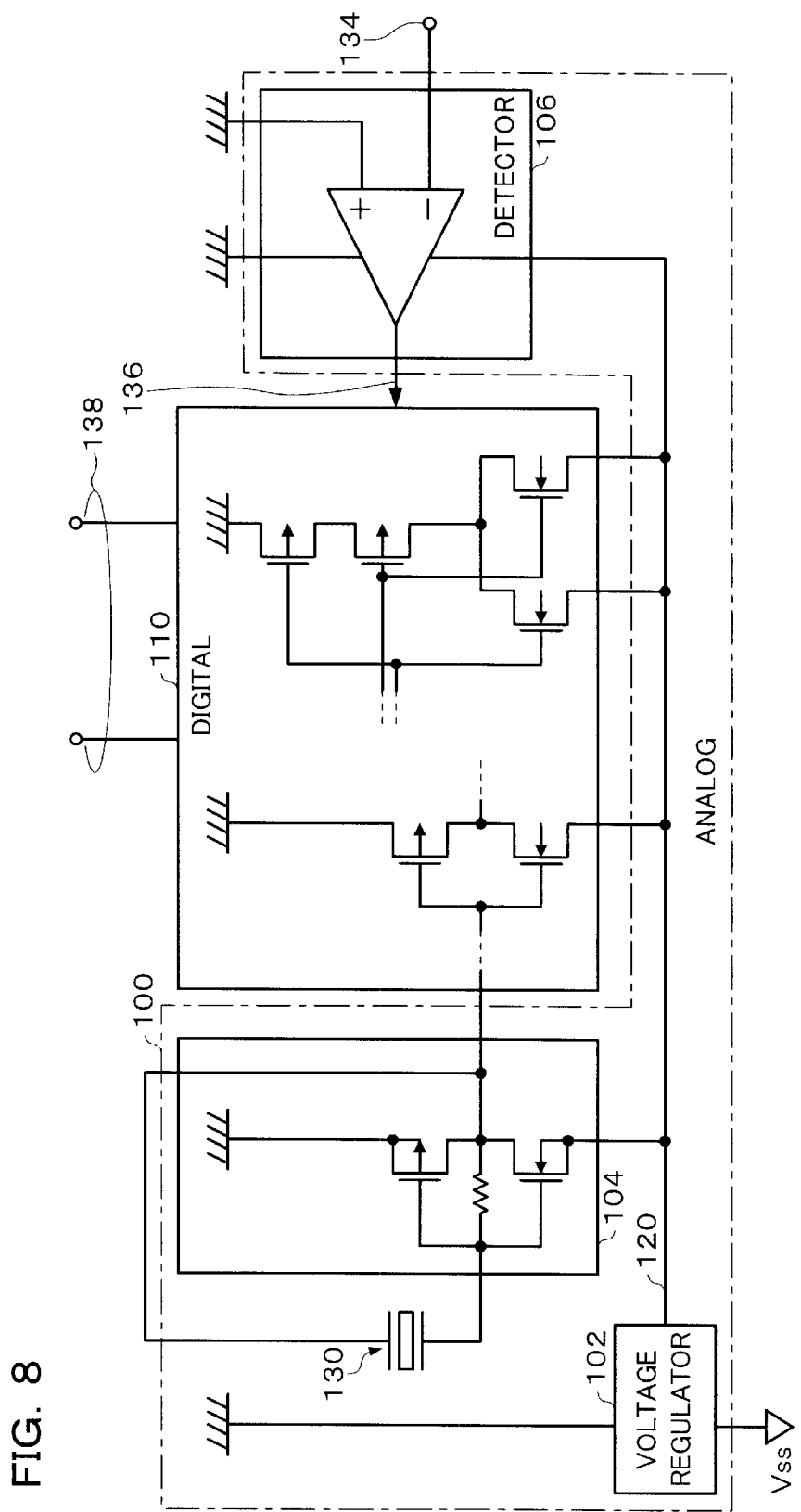
FIG. 8 shows an example of the configuration of the wristwatch IC in accordance with this embodiment shown in FIG. 7.

An example of structural components of the wristwatch IC in accordance with the embodiment of FIG. 7 is shown in FIG. 8.

It should be noted that portions that are similar to those of the wristwatch IC shown in FIG. 7 are given the same reference numbers and further description thereof is omitted.

If the first power line $V_{DD}$ is assumed to be ground level, the voltage regulator circuit 102 of this wristwatch IC is supplied with external power through the second power line $V_{SS}$, from outside of the IC.

The voltage regulator circuit 102 supplies the other circuits with a given low constant voltage generated through the power line 120 with respect to ground level.

The oscillator 104 extracts a 32-kilohertz (kHz) oscillation output from an externally connected 32-kHz quartz oscillator 130, and supplies it to the digital circuit section 110.

The digital circuit section 110 is configured of the logical circuits shown in FIG. 8, in which the oscillation output from the oscillator 104 is sequentially divided by the divider 112 therein to generate a divider output at 0.1 Hz, by way of example.

The detector 106 detects various notification signals which indicate the operation state of a main timepiece unit (not shown in the figure) and which are input from an operation state notification signal terminal 134, then outputs a corresponding detection result signal 136 to the controller 114 of the digital circuit section 110.

The controller 114 of the digital circuit section 110 controls output timings of a dividing signal 132 output from the divider 112 or the like in accordance with a result shown by the detection result signal 136 from the detector 106. For example, it monitors the movement of the hands of the main timepiece unit (not shown in the figure) by the various notification signals from the operation state notification signal terminal 134 through the detector 106, generates and supplies a clock signal 138 at accurate timing by the controller 114, and controls the movement of the hands of the main timepiece unit.

2.2 Digital Circuit Portion

The digital circuit section 110 is a logic circuit that performs logical operations and is usually the component with the largest number of elements within a wristwatch IC.

In this embodiment of the present invention, the digital circuit section 110 comprising the divider 112 and the controller 114 is designed to be configured of a body-floated type of PD SOI MOSFET.

This use of the body-floated structure makes it possible to implement MOSFETs of the minimum dimensions set by the design rules, and ideally reduces the junction capacitance.

The substrate floating effect of the body region can be actively utilized by the use of the body-floated type of PD SOI MOSFET so that the threshold voltage during actual operation (AC operation) can be further reduced with respect to the threshold voltage during DC operation, and thus implement low-voltage driving of the digital circuit section 110 that occupies are large proportion of the wristwatch IC. This makes it possible to design efficiently for extremely low power consumptions. Thus the digital circuit section 110 can be supplied from the voltage regulator circuit 102 with the ultra-low constant voltage that is necessary for the active utilization of the above described substrate floating effect in a body-floated type of PD SOI MOSFET.

2.3 Analog Circuit Portion

In the analog circuit section 100 of this embodiment of the invention, PD SOI MOSFETs of the body-tied structure are utilized for some of the MOSFETs of the voltage regulator circuit 102 (which is supplied with an external power voltage through the second power line $V_{SS}$) and the detector 106 (which is not supplied with the ultra-low constant voltage from the voltage regulator circuit 102 but receives signals from the exterior). This makes it possible to suppress the substrate floating effect of the body region and obtain analog characteristics of a level similar to those of bulk-structure MOSFETs.

In addition, the oscillation inverters of the oscillator 104 are also formed of PD SOI MOSFETs of the body-tied structure. This is because it is necessary to obtain analog characteristics that are not dependent on frequency or voltage, especially in the oscillator. In other words, it is possible to achieve operation at a low power consumption and a stable oscillation output by using PD SOI MOSFETs of the body-tied structure in the oscillator 104 to enable operation at an ultra-low constant voltage.

It is possible to design for operation at an even lower power consumption by configuring the detector 106 of a body-floated structure, other than the interface portion that is not supplied with the ultra-low constant voltage from the voltage regulator circuit 102 and receives signal from the exterior.

It is possible to restrain the operation current in this analog circuit section 100 and also operate with a MOSFET operation current in the subthreshold region on the order of 1 nA, by further supplying a constant current and using constant-current drive. This ensures operation with a low current consumption and operation at a constant voltage.

In particular, it is possible to guarantee operation of the oscillator 104 at a low constant voltage by selectively doping impurities into the p-channel and n-channel SOI MOSFETs of the oscillator inverter of the oscillator 104 and controlling the threshold voltages of the other MOSFETs of the analog circuit section 100 to be even lower.

2.4 Voltage Regulator Circuit 2.4.1 Circuit Configuration

Figure 9:
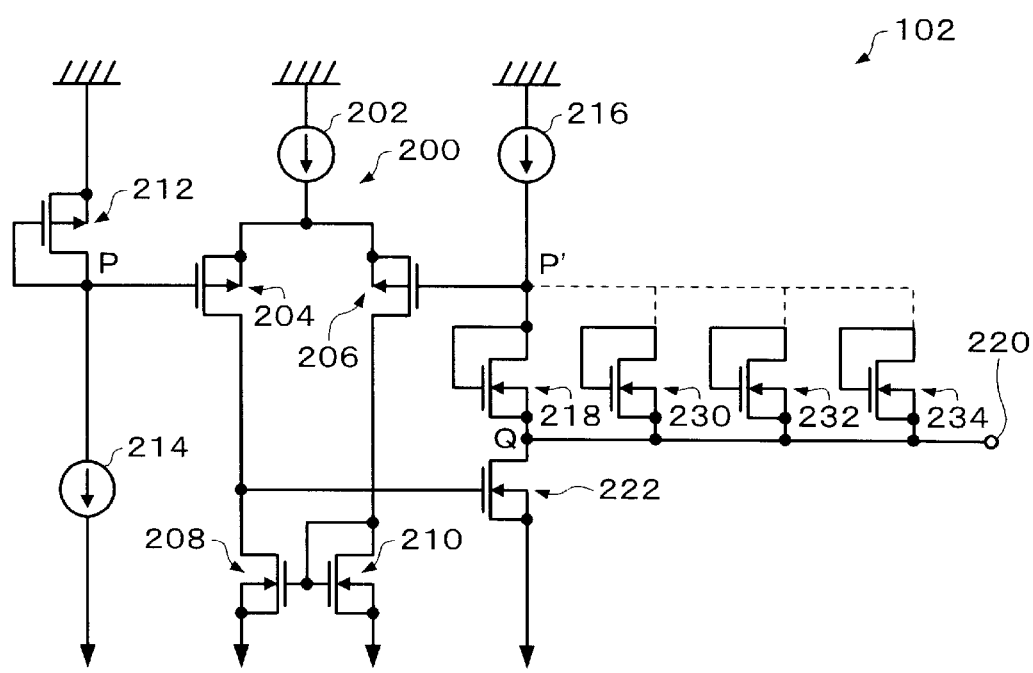
FIG. 9 shows an example of the configuration of a voltage regulator circuit in accordance with this embodiment.

An example of the structural components of the voltage regulator circuit 102 in accordance with this embodiment of the present invention, described above with reference to FIGS. 7 and 8, is shown in FIG. 9.

The p-channel and n-channel PD SOI MOSFETs that are comprised within the voltage regulator circuit 102 of this embodiment of the present invention are all of the body-tied structure where the body region is connected to the source region, as shown in FIG. 9.

First of all, this voltage regulator circuit 102 comprises a differential-pair type of comparator circuit 200.

This differential-pair comparator circuit 200 comprises a constant-current source 202, p-channel MOSFETs 204 and 206, land n-channel MOSFETs 208 and 210 on the load side.

One end of the constant-current source of the differential-pair comparator circuit 200 is connected to ground (the first power line $V_{DD}$) and the other end is connected to the source terminals of the p-channel MOSFETs 204 and 206.

The drain terminals of the p-channel MOSFETs 204 and 206 are connected to the drain terminals of the corresponding n-channel MOSFETs 208 and 210 on the load side.

The gate terminals of the load-side n-channel MOSFETs 208 and 210 are connected together and the gate terminal and drain terminal of the n-channel MOSFET 210 are connected. This forms a mirror circuit on the load side.

The source terminal of the p-channel MOSFET 212 is connected to ground (the first power line $V_{DD}$) and the gate terminal and drain terminal thereof are connected together. The gate and drain terminals are connected to a node P. The gate terminal of the p-channel MOSFET 204 and the other end of a constant-current source 214, whose other end is connected to the second power line $V_{SS}$, are connected to this node P.

One end of another constant-current source 216 is connected to ground (the first power line $V_{DD}$) and the other end is connected to a node P'. The gate terminal of the p-channel MOSFET 206 and the drain terminal of an n-channel MOSFET 218 are also connected to this node P'.

The gate and drain terminals of the n-channel MOSFET 218 are connected together and the source terminal thereof is connected to a node Q. An output terminal 220 that outputs an ultra-low constant voltage with reference to the ground level (the voltage potential level of the first power line) and the drain terminal of an n-channel MOSFET 222 are also connected to this node Q.

The gate terminal of the n-channel MOSFET 222 is connected to the drain terminals of the p-channel MOSFET 204 and the n-channel MOSFET 208. The source terminal of the n-channel MOSFET 222 is connected to the second power line $V_{SS}$. This n-channel MOSFET 222 is an output-control transistor.

Three n-channel MOSFETs 230, 232, and 234 are connected in parallel with the n-channel MOSFET 218 between nodes P' and Q. The drain and gate terminals of each of the n-channel MOSFETs 230, 232, and 234 are connected together.

Although three MOSFETs 230, 232, and 234 are connected in parallel with then-channel MOSFET 218 in this case, any other number of MOSFETs, such as one, two, or four or more MOSFETs could equally well be connected thereto.

2.4.2 Outline of Operation

The voltage regulator circuit 102 that is configured as described above is set in such a manner that the voltage potential of node P, which is the voltage potential of the drain terminal of the p-channel MOSFET 212, causes the flow of a constant current that is supplied by the constant-current source 214. The voltage potential of this node P is input to the gate terminal of the p-channel MOSFET 204, which is one of the input terminals of the differential-pair comparator circuit 200.

A voltage potential that has been controlled by the output-control n-channel MOSFET 222 and n-channel MOSFET 218 is generated at node P' and voltage potential of this node P' is fed back to the gate terminal of the p-channel MOSFET 206 that is the other input terminal of the differential-pair comparator. This configuration ensures that the nodes P and P' are controlled to be at the same voltage potential by the operation of the differential-pair p-channel MOSFETs 204 and 206 and the output-control n-channel MOSFET 222. The current flowing through node P' is fixed by the constant-current source 216, so that the voltage potential different between nodes Q and P' is at a constant voltage ($V_N$) controlled by the n-channel MOSFET 218.

This ensures that a constant voltage $V_Q$ supplied from the output terminal 220 is the sum of a voltage potential difference $V_p$ generated by the p-channel MOSFET 212, with reference to the ground level (the voltage potential level of the first power line), and a voltage potential difference $V_N$ generated by the n-channel MOSFET 218.

2.4.3 Constant Voltage Adjustment

Since the constant voltage $V_Q$ supplied from the output terminal 220 with reference to the ground level (the voltage potential level of the first power line) will fluctuate with variations in the MOSFET threshold voltages that occur during the fabrication of the semiconductor integrated circuit, this embodiment of the present invention also provides an n-channel MOSFET having a W/L ratio that differs from the W/L ratio of the n-channel MOSFET 218, so that a desired constant voltage can be supplied by switching wires.

By setting each of the n-channel MOSFETs 230, 232, and 234 to have different W/L ratios and current amplification ratios in such a case, it is possible to connect or disconnect any MOSFET as required by using non-volatile memory such as variations in the mask used for photolithography (master slice) during the fabrication of the semiconductor integrated circuit to select the wires (such as aluminum wires) connecting the MOSFETs or the fusing of fuse wires. This makes it possible to select an n-channel MOSFET of any desired W/L ratio and thus adjust the very low voltage value in a highly precise manner.

2.4.4 Relationship of Circuit Operation-Stopped Voltage $V_{STO}$

A circuit operation-stopped voltage $V_{STO}$ is determined for the oscillator 104, digital circuit section 110, and detector 106 which operate on the constant voltage that is generated by the voltage regulator circuit 102 with reference to the ground level (the voltage potential level of the first power line). In order to design for the lowest possible power consumption, therefore, the value of the constant voltage to be generated by the voltage regulator circuit 102 must be higher than the circuit operation-stopped voltage $V_{STO}$ within the permissible operation temperature range, but also as low as possible.

Since the circuit operation-stopped voltage $V_{STO}$ depends on the threshold voltages of the MOSFETs configuring the circuit that supplies the low voltage, the voltage regulator circuit 102 in accordance with this embodiment of the invention ensures that a constant voltage that is the sum of Vds (voltage between drain and source) of the saturated-connected p-channel MOSFET 212 and Vds of the saturated-connected n-channel MOSFET 218, by adjusting the value of the constant current.

The constant voltage $V_Q$ supplied from the output terminal 220, therefore, is dependent on the sum of the threshold voltages $V_{thN}$ and $|V_{thP}|$ of the p-channel MOSFET 212 and the n-channel MOSFET 218.

This makes the temperature gradient of the low constant voltage generated by the voltage regulator circuit 102 equal to that of the circuit operation-stopped voltage $V_{STO}$ of the circuit that is supplied with this low constant voltage, making it possible to design efficiently for a lower power consumption by always supplying a constant voltage that is only slightly higher than the circuit operation-stopped voltage $V_{STO}$, without setting the value of the constant voltage in a wasteful manner within the permissible operation temperature range.

2.5 Comparative Examples

Figure 10:
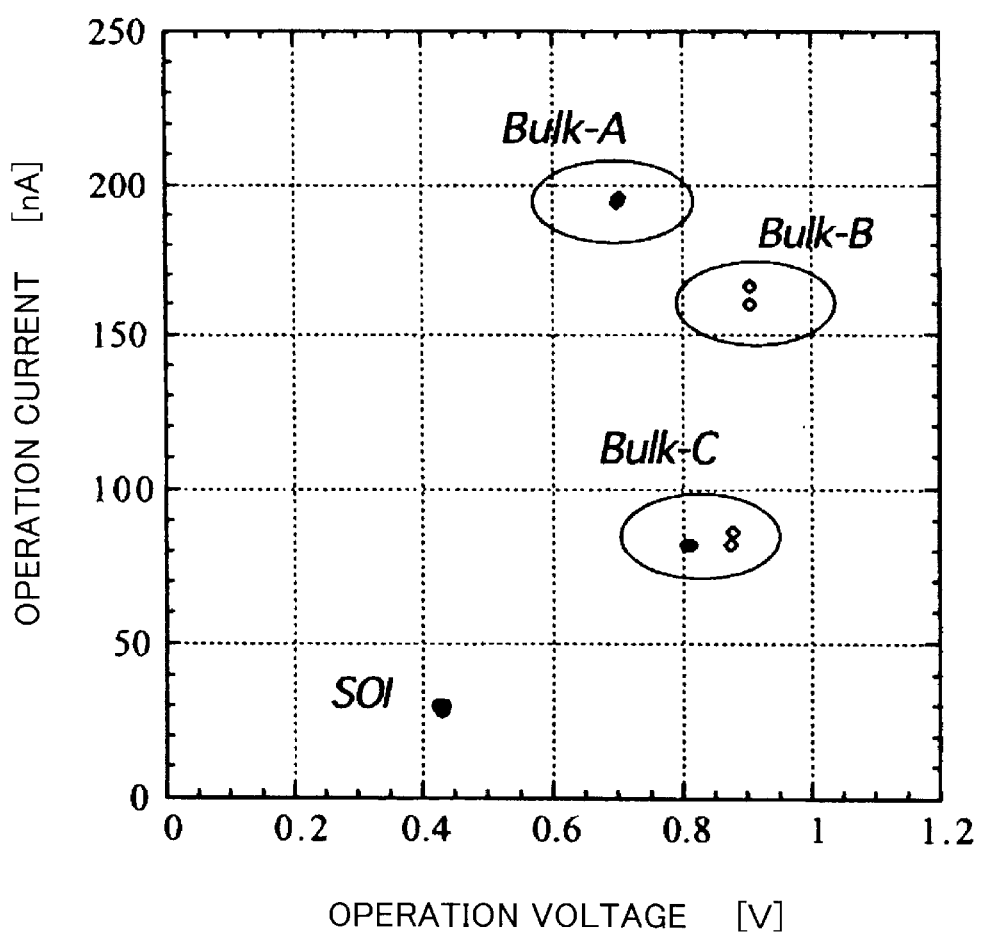
FIG. 10 is illustrative of the relationship between operation voltage and operation current in the wristwatch ICs configured of bulk-structure MOSFETs and SOI MOSFETs in accordance with this embodiment.

The relationship between operation voltage and operation current in wristwatch ICs configured of bulk-structure MOSFETs and SOI MOSFETs in accordance with the present embodiment is shown in FIG. 10.

This graph shows the operation voltage and operation current of wristwatch ICs fabricated of SOI MOSFETs in accordance with this embodiment of the invention, which were fabricated with an operation voltage of 0.5 V, design rules of 0.6 μm, and chip dimensions of 2.0 mm×2.0 mm, together with comparative examples that are prior-art bulk-structure wristwatch ICs (bulk-A to bulk-C).

In contrast with the prior-art bulk-structure wristwatch ICs which had an operation current of 82 nA and an operation voltage of 0.81V, the wristwatch ICs in accordance with this embodiment of the invention can operate at 30 nA and 0.42 V, making it possible to achieve a power consumption that is only one-fifth or one-sixth of that of the prior art.

As described above, this embodiment of the present invention provides a configuration in which logic circuitry consists of body-floated type of PD SOI MOSFETs and a low constant voltage is supplied thereto with reference to the voltage potential of a first power line, making it possible to avoid the effects of operation instability and kinking that are caused by the substrate floating effect that is inherent to the body-floated structure, thus enabling the provision of a semiconductor integrated circuit that can operate at an extremely low power consumption.

Since the voltage regulator circuit in accordance with this embodiment of the present invention is configured of a body-tied structure, a power voltage is supplied from the exterior, and also a low constant voltage is supplied by the voltage regulator circuit comprising body-floated circuitry, it is possible to design efficiently for lower power consumptions.

Since an oscillator in accordance with this embodiment of the present invention is configured to have a body-tied structure and a low constant voltage generated by the voltage regulator circuit is supplied thereto, it is possible to operate with a stable oscillation output and at an extremely low power consumption, with no dependency on frequency or voltage.

3. Semiconductor Devices

A semiconductor integrated circuit in accordance with the above-described embodiment of the present invention can operate at extremely low power consumptions that have not been seen in the art, even when used to configure a semiconductor device mounted on a silicon chip or the like. It should be noted, however, that the semiconductor integrated circuit in accordance with this embodiment of the invention is comprised within the range of "semiconductor device".

Figure 11:
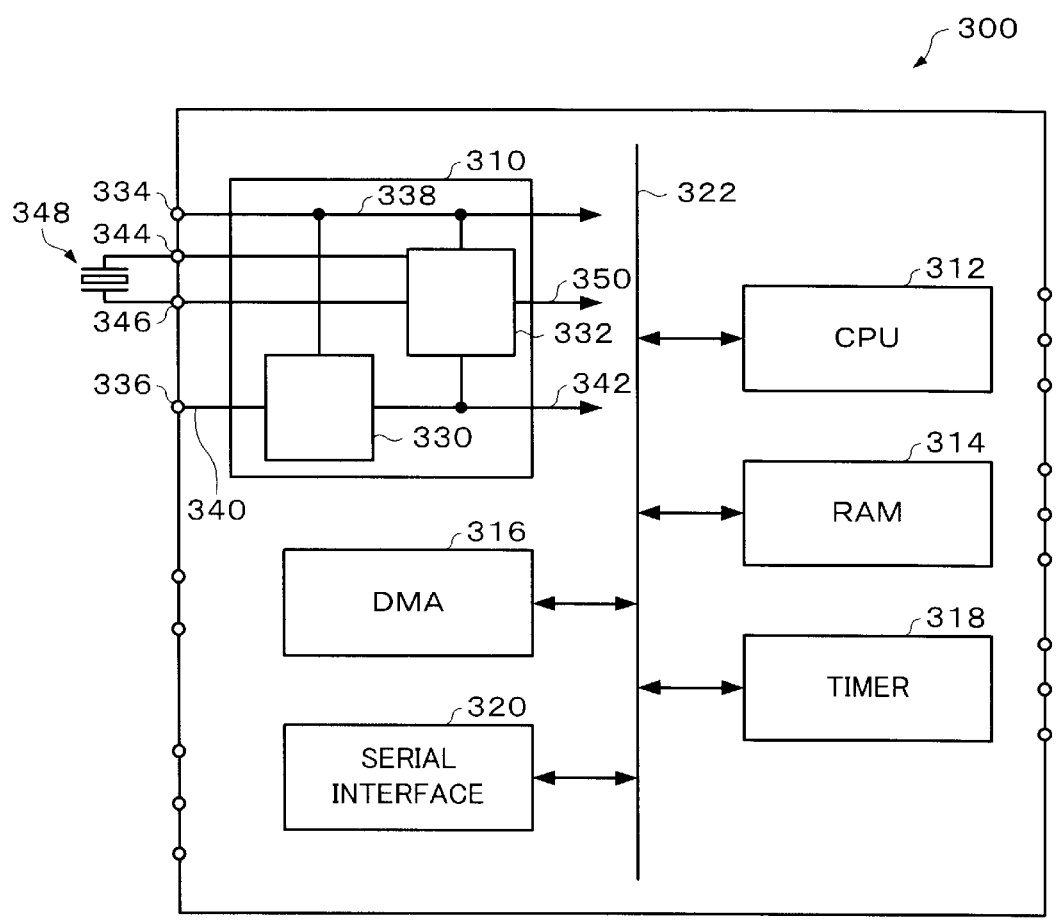
FIG. 11 is a block diagram of an example of the configuration of a semiconductor device incorporating the semiconductor integrated circuit in accordance with this embodiment.

An example of the configuration of a semiconductor device incorporating the semiconductor integrated circuit of this embodiment of the invention is shown in FIG. 11.

This semiconductor device 300 comprises a silicon chip on which is mounted components such as a power-source/clock-generation circuit 310 that includes the previously described voltage regulator circuit and oscillator of this embodiment of the present invention, a CPU 312, RAM 314, a DMA 316, a timer circuit 318, and a serial interface circuit 320, together with a plurality of external terminals. The CPU 312, the RAM 314, the DMA 316, the timer circuit 318, and the serial interface circuit 320 are connected to each other by a bus 322.

The circuits within the silicon chip receive inputs from an external semiconductor device through the various external terminals and operational signals of those circuits are output to the exterior to the semiconductor device through those external terminals.

A silicon chip on which the semiconductor device 300 of this embodiment is mounted is characterized in that part of the power-source/clock-generation circuit 310 is configured of a PD type of SOI MOSFET of the body-tied structure; and also at least one of the CPU 312, the RAM 314, the DMA 316, the timer circuit 318, and the serial interface circuit 320 comprises a circuit configured of a PD type of SOI MOSFET of the body-floated structure.

The power-source/clock-generation circuit 310 comprises a voltage regulator circuit 330 and a clock signal generation circuit 332, where the voltage regulator circuit 330 is connected to first and second power wires 338 and 340 that are connected to the first and second power lines by power terminals 334 and 336, and the clock signal generation circuit 332 is connected to the first power wire 338 and a low constant voltage supply wire 342 for supplying a low constant voltage generated by the voltage regulator circuit 330.

A quartz oscillator 348 is connected externally by quartz oscillator connection terminals 344 and 346 to the clock signal generation circuit 332, which is configured to divide an oscillation signal of a given frequency and output a clock signal 350.

A circuit configured of a PD SOI MOSFET of the body-floated structure is connected to the first power wire 338 and the low constant voltage supply wire 342, and the clock signal 350 generated by the clock signal generation circuit 332 is supplied thereto.

This ensures that PD SOI MOSFETs of the body-floated structure are employed for the logic circuitry that forms the greater part of the above described circuitry, but a low constant voltage that reduces the effects of substrate floating is supplied thereto. In addition, the voltage regulator circuit 330 that generates this low constant voltage and the oscillatorry for obtaining the oscillation output are configured of PD SOI MOSFETs of the body-tied structure. This makes it possible to provide a semiconductor device that can operate at an extremely low power consumption, without increasing the fabrication costs.

Note that an even lower power consumption can be achieved by employing PD SOI MOSFETs of the body-floated structure for performing logical operations in the circuitry for dividing the oscillation output of the clock signal generation circuit 332.

4. Electronic Equipment

It is possible to achieve a lower power consumption for electronic equipment by utilizing the above described semiconductor integrated circuit (semiconductor device) in that electronic equipment. In other words, when electronic equipment is operation under battery power, it is possible to increase the life of that battery and thus provide electronic equipment that is convenient for the user. Note that the present invention is not limited to the wristwatch of this embodiment and thus it can be applied to various other portable information terminal devices.

Figure 12A:
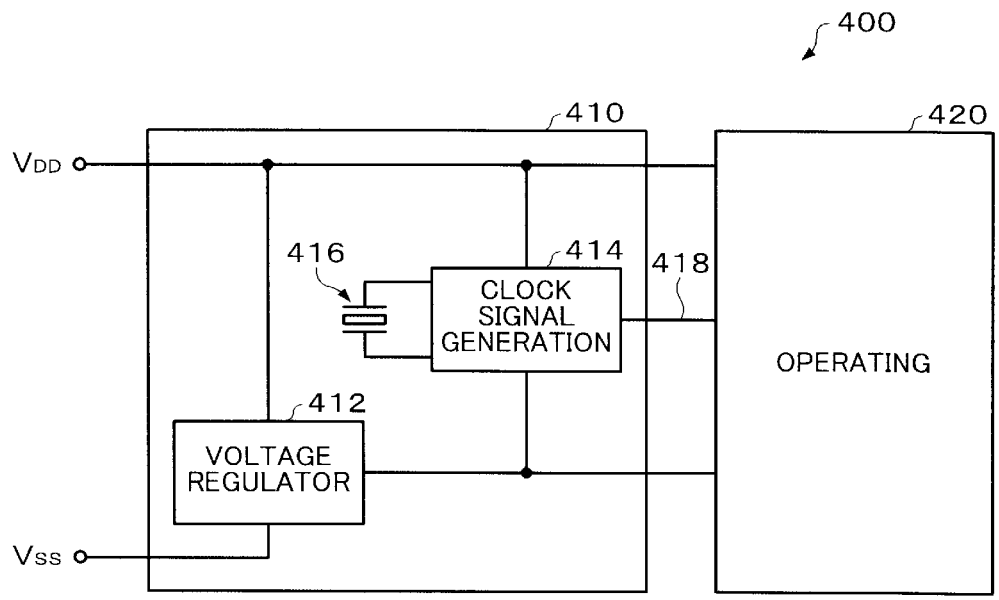
FIGS. 12A and 12B are block diagrams of examples of electronic equipment in accordance with this embodiment.
Figure 12B:
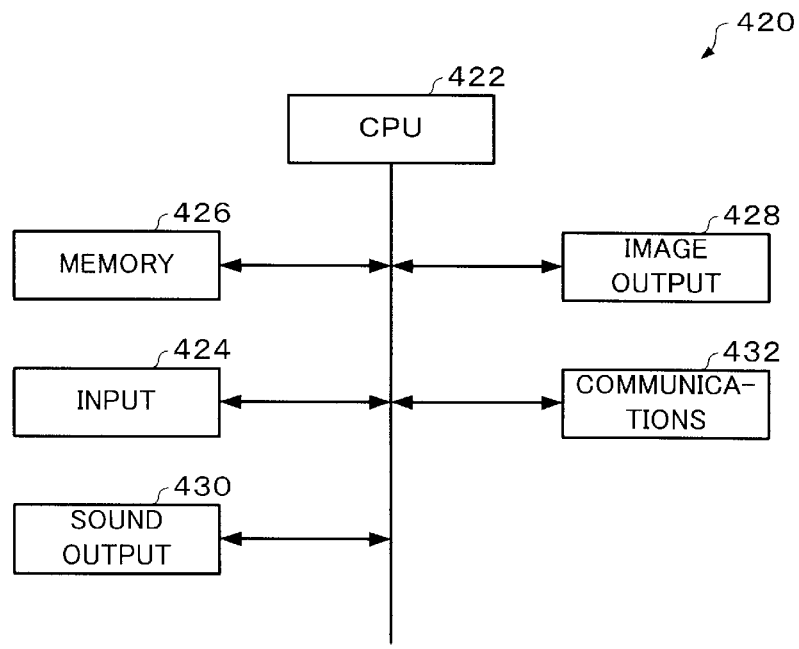

Typical block diagrams of electronic equipment in accordance with embodiments of the present invention are shown in FIGS. 12A and 12B.

This electronic equipment 400 comprises a power-source/clock-generation circuit 410, which generates an ultra-low constant voltage and a corresponding clock signal, and an operating circuit 420 that performs a given operation in accordance with the clock signal, using that ultra-low constant voltage as an operation voltage.

The power-source/clock-generation circuit 410 comprises a voltage regulator circuit 412 and a clock signal generation circuit 414.

The voltage regulator circuit generates an ultra-low constant voltage from the voltage potential difference between the first power line $V_{DD}$ and the second power line $V_{SS}$, and is configured of a PD type of SOI MOSFET with a body-tied structure.

The clock signal generation circuit 414 uses a voltage potential difference between the first power line $V_{DD}$ and the ultra-low constant voltage generated by the voltage regulator circuit 412 as an operation voltage, it extracts an oscillation output from an externally connected quartz oscillator 416, and divides that to generate a clock signal 418. Portion that extracts the oscillation output from the clock signal generation circuit 414 can be configured of a PD type of SOI MOSFET with a body-tied structure and the division portion can be configured of a PD type of SOI MOSFET with a body-floated structure.

The operating circuit 420 performs a given logical operation in accordance with this clock signal 418 and is configured of a PD type of SOI MOSFET with a body-floated structure.

As shown in FIG. 12B, the operating circuit 420 comprises a CPU ( or the semiconductor integrated circuit (semiconductor device) in accordance with this embodiment of the present invention) 422, an input section 424, a memory 426, an image output section 428, a sound output section 430, and a communications section 432.

The components that perform these logical operations could be PD SOI MOSFETs of the body-floated structure.

In this case, the input section 424 is designed to input various types of data. The CPU ( or the semiconductor integrated circuit (semiconductor device) in accordance with this embodiment of the present invention) 422 executes various processes based on data that is input by the input section 424. The memory 426 acts as a work area for the CPU (or the semiconductor integrated circuit (semiconductor device) in accordance with this embodiment of the present invention) 422. The image output section 428 is designed to output various images (text, icons, or graphics) that the electronic equipment will display, and the functions thereof can be implemented by hardware such as an LCD or CRT. The sound output section 430 is designed to output the various sounds (such as voices and game sounds) that the electronic equipment will output, and the functions thereof can be implemented by hardware such as a speaker.

Figure 13A:
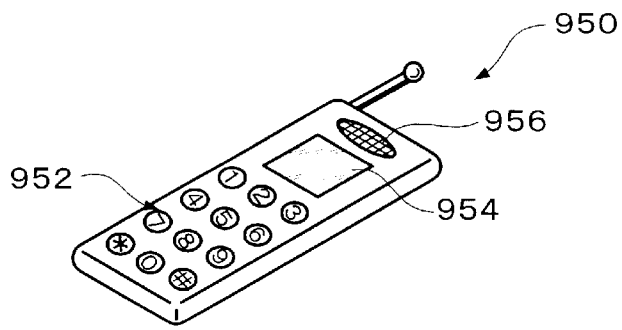
FIGS. 13A, 13B, and 13C are external views of various items of electronic equipment.

An external view of a portable telephone 950 that is an example of electronic equipment in accordance with this embodiment is shown in FIG. 13A. This portable telephone 950 is provided with dial buttons 952 that function as an input section, an LCD 954 that functions as an image output section for displaying information such as phone numbers, names, and icons, and a speaker 956 that functions as a sound output section for outputting sounds.

Figure 13B:
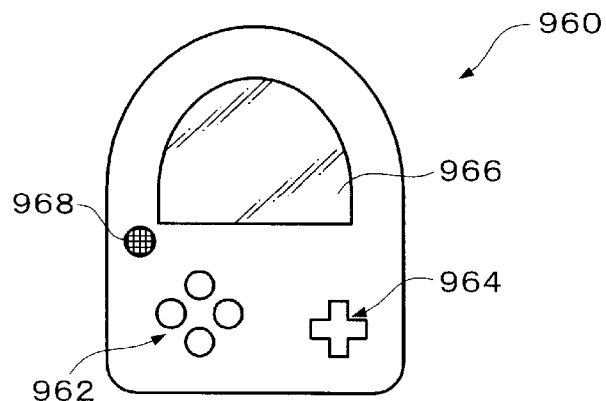

An external view of a portable game machine 560 that is another example of electronic equipment in accordance with this embodiment is shown in FIG. 13B. This portable game machine 960 is provided with operation buttons 962 that function as an input section, a cross-shaped control key 964, an LCD 966 that functions as an image output section for displaying game images, and a speaker 968 that functions as a sound output section for outputting game sounds.

Figure 13C:
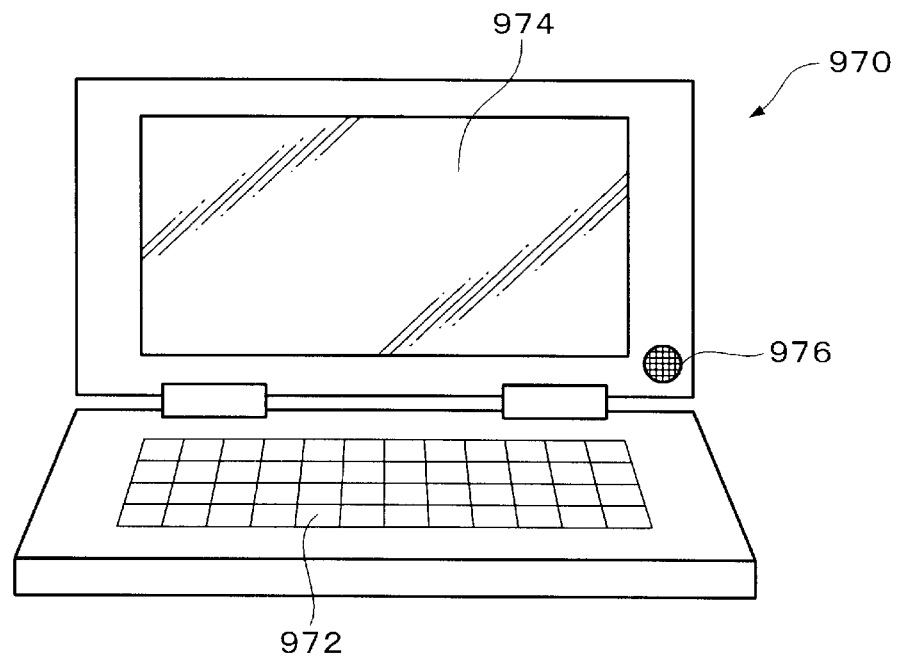

An external view of a personal computer 970 that is a further example of electronic equipment in accordance with this embodiment is shown in FIG. 13C. This personal computer 970 is provided with a keyboard that functions as an input section, an LCD 974 that functions as an image output section for displaying images such as text, numerics, and graphics, and a sound output section 976.

The incorporation of the semiconductor integrated circuit (semiconductor device) in accordance with this embodiment of the invention into the items of electronic equipment shown in FIGS. 13A, 13B, and 13C makes it possible to implement electronic equipment with extremely low power consumptions.

In addition to the equipment shown in FIGS. 13A, 13B, and 13C, it is possible to consider further examples of electronic equipment that can utilize this embodiment of the present invention, such as portable information terminals, pagers, electronic calculators, devices provided with touch-panels, projectors, word-processors, video cassette recorders with either viewfinders or direct-view monitors, car-navigation devices, and printers.

Note also that the present invention is not limited to the embodiments described herein, and thus it can be modified in many ways within the scope laid out herein.

What is claimed is:

1. A semiconductor integrated circuit, comprising:
   a first power line which supplies a first voltage potential;
   a second power line which supplies a second voltage potential that is lower than the first voltage potential;
   a voltage regulator circuit connected electrically to the first and second power lines;
   a third power line which supplies a constant voltage generated by the voltage regulator circuit, with reference to the first voltage potential; and
   an operating circuit connected electrically to the first and third power lines;
   wherein at least one transistor among transistors comprising the voltage regulator circuit is a partially-depleted SOI field-effect transistor in which a body region and a source region are connected electrically; and wherein at least one transistor among transistors comprising the operating circuit is a partially-depleted SOI field-effect transistor in which the body region is in an electrically floating state.

2. The semiconductor integrated circuit as defined in claim 1, further comprising:

first and second external terminals connected electrically to the first and second power lines, respectively, wherein the first and second voltage potentials are supplied to the first and second external terminals, respectively.

3. The semiconductor integrated circuit as defined in claim 2, wherein a value of the constant voltage corresponds to the sum of threshold voltages of n-channel and p-channel field-effect transistors that configure the operating circuit.

4. The semiconductor integrated circuit as defined in claim 3, further comprising:

an oscillator which is connected electrically to the first and third power lines to supply an oscillation output to the operating circuit, wherein at least one transistor among transistors comprising the oscillator is a partially-depleted SOI field-effect transistor in which a body region and a source region are connected electrically.

5. The semiconductor integrated circuit as defined in claim 2, further comprising:

an oscillator which is connected electrically to the first and third power lines to supply an oscillation output to the operating circuit, wherein at least one transistor among transistors comprising the oscillator is a partially-depleted SOI field-effect transistor in which a body region and a source region are connected electrically.

6. The semiconductor integrated circuit as defined in claim 1, wherein a value of the constant voltage corresponds to the sum of threshold voltages of n-channel and p-channel field-effect transistors that configure the operating circuit.

7. The semiconductor integrated circuit as defined in claim 6, further comprising:

an oscillator which is connected electrically to the first and third power lines to supply an oscillation output to the operating circuit, wherein at least one transistor among transistors comprising the oscillator is a partially-depleted SOI field-effect transistor in which a body region and a source region are connected electrically.

8. The semiconductor integrated circuit as defined in claim 1, further comprising:

an oscillator which is connected electrically to the first and third power lines to supply an oscillation output to the operating circuit, wherein at least one transistor among transistors comprising the oscillator is a partially-depleted SOI field-effect transistor in which a body region and a source region are connected electrically.

9. The semiconductor integrated circuit as defined in claim 1, wherein the voltage regulator circuit comprises:
a first constant-current source connected electrically at one end to the second power line;
a second constant-current source connected electrically at one end to the first power line;
a first SOI p-channel field-effect transistor in which a body region is connected electrically to a source region that is connected electrically to the first power line, and a gate electrode and a drain region are connected electrically to the other end of the first constant-current source;
a differential-pair comparator circuit connected electrically at one end to the gate electrode of the first SOI p-channel field-effect transistor and at the other end to the other end of the second constant-current source;
a first SOI n-channel field-effect transistor in which a body region is connected electrically to a source region and a gate electrode is connected electrically to the other end of the second constant-current source; and
at least one second SOI n-channel field-effect transistor having:
a gate electrode which is connected electrically to one of differential outputs of the differential-pair comparator circuit that is connected to the gate electrode of the first SOI p-channel field-effect transistor;
a body region and a source region which are connected electrically to the second power line; and
a drain region which is connected electrically to the source region of the first SOI n-channel field-effect transistor;
wherein the sum of threshold voltages of the first SOI p-channel and n-channel field-effect transistors is generated as a constant voltage to be supplied to the third power line with reference to the first voltage potential, by adjusting a drain current of second n-channel field-effect transistor.

10. The semiconductor integrated circuit as defined in claim 9, wherein the second SOI n-channel field-effect transistors are comprised between the source region and drain region of the first SOI n-channel field-effect transistor, each of the second SOI n-channel field-effect transistors having a body region that is electrically connected to a corresponding source region and also having a gate electrode that is connected electrically to the other end of the second constant-current source; and wherein a value of the constant voltage with reference to the first voltage potential is adjusted by cutting at least one of wires which connect the second SOI n-channel field effect transistors by changing a mask for the photolithography during the fabrication of the semiconductor integrated circuit.

11. The semiconductor integrated circuit as defined in claim 10, wherein the second SOI n-channel field-effect transistors have mutually different ratios of gate-width/gate-length (W/L).

12. The semiconductor integrated circuit as defined in claim 9, wherein the second SOI n-channel field-effect transistors are comprised between the source region and drain region of the first SOI n-channel field-effect transistor, each of the second SOI n-channel field-effect transistors having a body region that is electrically connected to a corresponding source region and also having a gate electrode that is connected electrically to the other end of the second constant-current source; and wherein a value of the constant voltage with reference to the first voltage potential is adjusted by cutting at least one of fuse wires which connect the second SOI n-channel field-effect transistors.

13. The semiconductor integrated circuit as defined in claim 12, wherein the second SOI n-channel field-effect transistors have mutually different ratios of gate-width/gate-length (W/L).

14. A timepiece, comprising:
a semiconductor integrated circuit including:
   a first power un which supplies a first voltage potential;
   a second power line which supplies a second voltage potential that is lower than the first voltage potential;
   a voltage regulator circuit connected electrically to the first and second power lines;
   a third power line which supplies a constant voltage generated by the voltage regulator circuit, with reference to the first voltage potential; and
   an operating circuit connected electrically to the first and third power lines,
   wherein at least one transistor among transistors comprising the voltage regulator circuit is a partially-depleted SOI field-effect transistor in which a body region and a source region are connected electrically, and wherein at least one transistor among transistors comprising the operating circuit is a partially-depleted SOI field-effect transistor in which the body region is in an electrically floating state.

15. A timepiece, as defined by claim 14, further comprising:
   a detector which is connected electrically to the first and third power lines to detect a given signal from an external main timepiece unit,
   wherein at least part of the detector is formed of a partially-depleted SOI field-effect transistor in which a body region and a source region are connected electrically, and
   wherein the operating circuit performs a given operation in accordance with a detection result of the detector.

16. Electronic equipment, comprising:
a semiconductor integrated circuit including:
   a first power line which supplies a first voltage potential;
   a second power line which supplies a second voltage potential that is lower than the first voltage potential;
   a voltage regulator circuit connected electrically to the first and second power lines;
   a third power un which supplies a constant voltage generated by the voltage regulator circuit, with reference to the first voltage potential; and
   an operating circuit connected electrically to the first and third power lines,
   wherein at least one transistor among transistors comprising the voltage regulator circuit is a partially-depleted SOI field-effect transistor in which a body region and a source region are connected electrically, and wherein at least one transistor among transistors comprising the operating circuit is a partially-depleted SOI field-effect transistor in which the body region is in a electrically floating state.

17. Electronic equipment as defined by claim 16, further comprising:
   a detector which is connected electrically to the first and third power lines to detect a given input signal,
   wherein at least art of the detector is formed of a partially-depleted SOI field-effect transistor in which a body region and a source region are connected electrically, and
   wherein the operating circuit performs a given operation in accordance with a detection result of the detector.

18. A semiconductor integrated circuit, comprising:
a first power line which supplies a first voltage potential;
a second power line which supplies a second voltage potential that is lower than the first voltage potential;
a first circuit connected electrically to the first and second power lines;
a third power line which supplies a voltage generated by the first circuit with reference to the first voltage potential; and
a second circuit connected electrically to the first and third power lines,
wherein at least one transistor among transistors comprising the first circuit is a partially-depleted SOI field-effect transistor in which a body region and a source region are connected electrically; and
wherein at least one transistor among transistors comprising the second circuit is a partially-depleted SOI field-effect transistor in which the body region is in an electrically floating state.

19. A semiconductor integrated circuit, comprising:
a digital circuit section;
an analog circuit section;
wherein the digital circuit section comprises a plurality of field-effect transistors and at least one transistor is a partially-depleted SOI field-effect transistor in which a body region is in an electrically floating state; and
wherein the analog circuit section comprises a plurality of field-effect transistors and at least one transistor is a partially-depleted SOI field-effect transistor in which a body region and a source region are connected electrically.

20. A semiconductor integrated circuit, comprising:
a first power line which supplies a first voltage potential;
a second power line which supplies a second voltage potential that is lower than the first voltage potential;
a voltage regulator circuit connected electrically to the first and second power lines;
a third power line which supplies a constant voltage generated by the voltage regulator circuit, with reference to the first voltage potential; and
an operating circuit connected electrically to the first and third power lines;
wherein the entire voltage regulator circuit is made of a partially-depleted SOI field-effect transistor in which body region and a source region are connected electrically; and
wherein at least one transistor among transistors comprising the operating circuit is a partially-depleted SOI field-effect transistor in which the body region is in an electrically floating state.

21. A semiconductor integrated circuit, comprising:
a first power line which supplies a first voltage potential;
a second power line which supplies a second voltage potential that is lower than the first voltage potential;
a voltage regulator circuit connected electrically to the first and second power lines;
a third power line which supplies a constant voltage generated by the voltage regulator circuit, with reference to the first voltage potential; and
an operating circuit connected electrically to the first and third power lines;
wherein at least one transistor among transistors comprising the voltage regulator circuit is a partially-depleted SOI field-effect transistor in which a body region and a source region are connected electrically; and
wherein the entire operating circuit is made of a partially-depleted SOL field-effect transistor in which the body region is in an electrically floating state.

* * * * *